United States Patent [19]

Damiano et al.

[11] Patent Number: 5,493,194
[45] Date of Patent: Feb. 20, 1996

[54] CONTROL SIGNAL AND POWER BUS CONNECTOR ARRANGEMENT FOR A MULTI-AXIS MOTOR CONTROL

[75] Inventors: Michael Damiano, Germantown; John Brubaker; Enoch Smith, both of Milwaukee, all of Wis.

[73] Assignee: Allen-Bradley Company, Inc., Milwaukee, Wis.

[21] Appl. No.: 388,709

[22] Filed: Feb. 14, 1995

[51] Int. Cl.⁶ .............................. G05B 19/33; H02K 5/00
[52] U.S. Cl. .......................... 318/575; 318/567; 361/733; 439/928; 307/71
[58] Field of Search .................... 361/729, 730, 361/733, 735, 775, 683, 788, 686, 688, 356; 439/926, 928, 294, 347, 631, 626; 318/567, 575, 579, 560, 563; 307/71, 85, 43, 135

[56] References Cited

U.S. PATENT DOCUMENTS

| | | | |
|---|---|---|---|
| 4,401,351 | 8/1983 | Record | 361/735 |
| 4,558,914 | 12/1985 | Prager et al. | 439/928 |
| 4,754,179 | 6/1988 | Capuano et al. | 361/356 |
| 4,790,762 | 12/1988 | Harms | 439/928 |
| 5,006,961 | 4/1991 | Monico | 439/928 |
| 5,315,488 | 5/1994 | LeGallo et al. | 361/788 |
| 5,339,014 | 8/1994 | Nesper | 318/563 |

FOREIGN PATENT DOCUMENTS 0515797  3/1992  European Pat. Off. .

Primary Examiner—John W. Cabeca
Attorney, Agent, or Firm—James G. Morrow; John M. Miller; John J. Horn

[57] ABSTRACT

A motor control system and the electrical bus for interconnecting the components of the control system are disclosed herein. The system includes a main motor control unit connected to four motor axis control modules. The control algorithms and commands for the system are stored and executed by the control unit which communicates control commands to the individual motor axis control modules. Each motor control module processes the control commands to control a motor connected to the module, and also communicates feedback signals produced at the associated axis to the control unit. The interconnection between the control unit and the modules is positioned at the face of the components to facilitate removal and insertion of the modules. The electrical bus includes both communications conductors and power conductors, and is included in the interconnection of the components. A portion of the system bus is supported by each of the system modules, wherein the bus is completed only if all of the system modules are in position and the connectors of each portion of the bus are engaged.

21 Claims, 7 Drawing Sheets

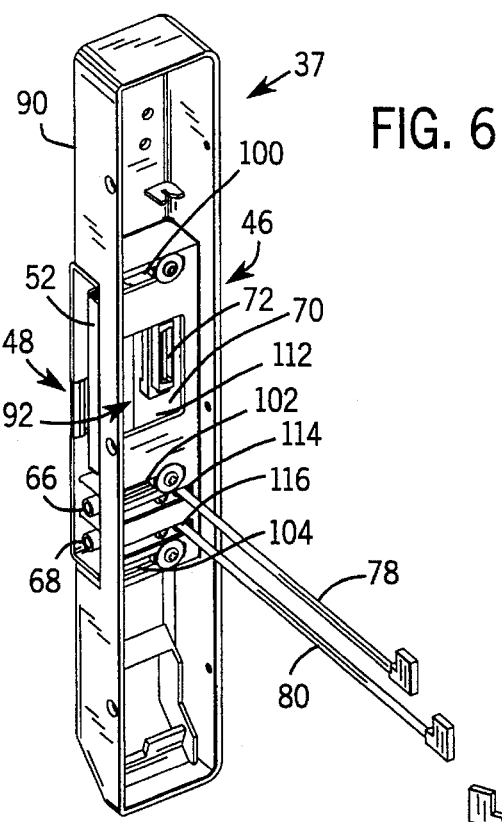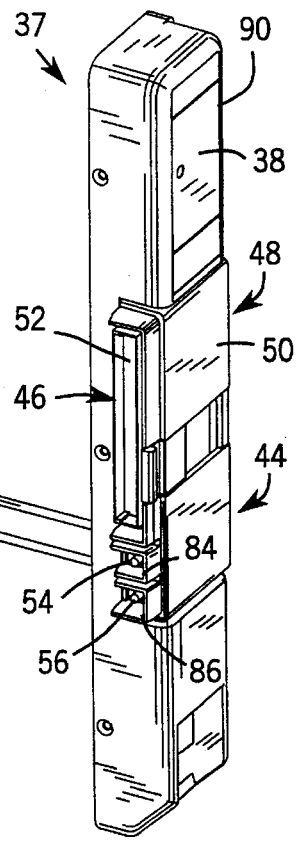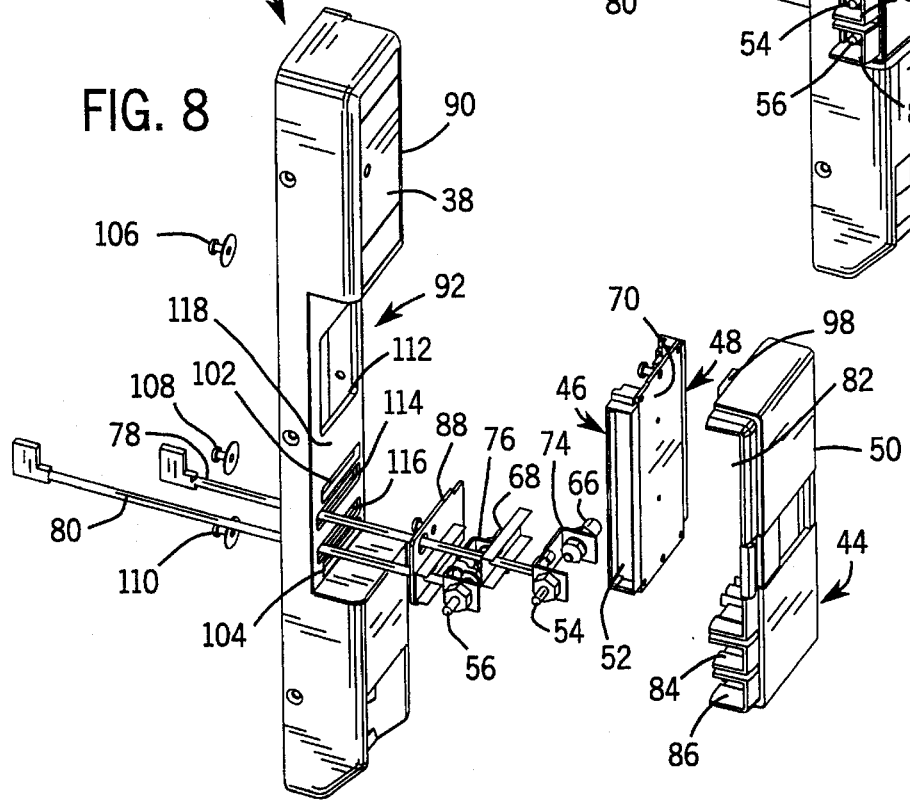

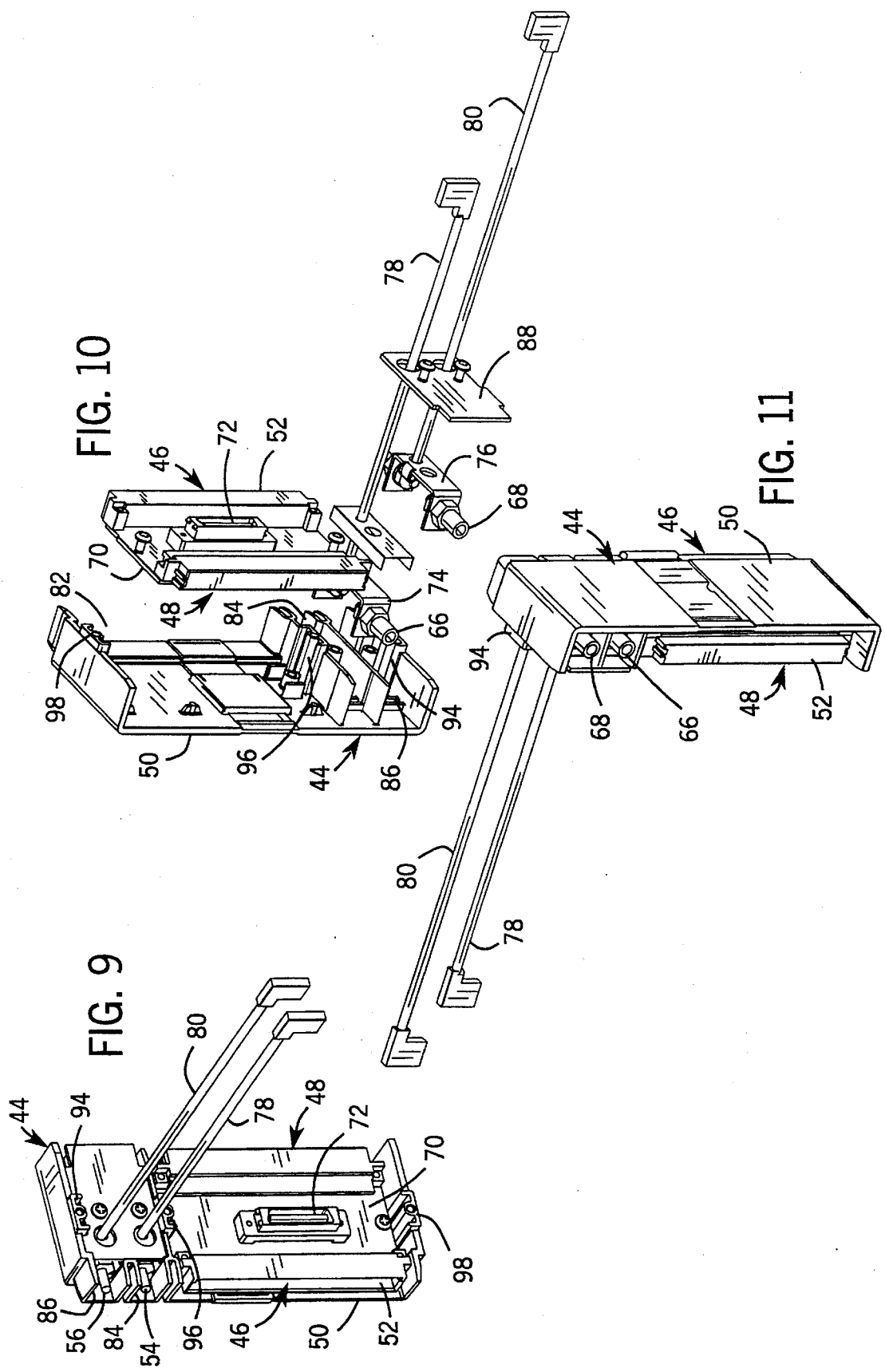

CONTROL SIGNAL AND POWER BUS CONNECTOR ARRANGEMENT FOR A MULTI-AXIS MOTOR CONTROL

FIELD OF THE INVENTION

The present invention relates to a multi-axis motor control system including a main control unit coupled to a plurality of axis module units. In particular, the present invention relates to the electrical and mechanical configuration of the control signal and power bus extending between the main control unit and the axis modules.

BACKGROUND OF THE INVENTION

Multi-axis motor controls are used in industrial automation and manufacturing systems such as conveyor lines and multi-axis machine tools which require coordinated and simultaneous control of multiple motors. Currently, these systems include a main control unit coupled to an axis module unit for each motor of the system. The main control unit is programmable and includes the timing and position programming required to properly control each of the motors in the system. The axis modules are each electrically connected to a respective motor to apply power to the motor based upon control signals from the control unit. The control unit receives feedback signals from the motor. The main control unit applies control signals to the axis modules based upon the feedback signals, and the timing and position programming stored therein.

In general, the main control unit and axis modules are located in separate physical housings, and mechanically supported adjacent to each other. This permits customizing the configuration and cost of a motor control to a specific system application by limiting the number of axis modules to the number of motors required in the system. However, this arrangement requires that appropriate power and signal conductors are provided between the main control unit and the axis modules.

Several methods have been utilized in the past to provide signal routing and addressing from the main control unit to associated axis modules. The most common method is based upon a back-plane type of construction upon which the signals for a particular mechanical location of an axis module terminate in a connector having connections unique to that mechanical location. One drawback with this type of construction is that the location of a particular axis module is fixed, and connections must be keyed to prevent improper connection. Furthermore, in the back-plane type of construction, the signals are routed behind the main control unit and axis modules. This configuration requires extender boards or other arrangements to make signals accessible for testing.

As an alternative to keying the position of a module to a mechanical location and associated address, axis modules have been designed to include address switches to identify the unique position of the module. One disadvantage of address switches is that the addressing of the module must be set whenever the module position is changed during procedures such as trouble shooting, module replacement or module upgrade. This type of addressing arrangement is problematic since it is error prone and dependent on the installer to correctly set the addressing.

Another method of signal routing and addressing is based upon the use of ribbon cable connecting the main control unit to each axis module. Ribbon cable is susceptible to damage, and care must be taken in handling to prevent the need to replace the entire cable when a single module in the string requires replacement. Furthermore, since the use of a ribbon cable is typically based upon a daisy chain arrangement, depending upon the location of the cable, substantially all of the axis modules may need to be disconnected to remove a module from the middle of the chain.

Turning to the conduction of the power (i.e. 2 kW to 5 kW) from the main control unit to the axis modules to power the associated motors, a frequently used technique is to attach copper or other suitable metal strips or bars between the control unit and axis modules using mechanical pressure type connections such as screws or electrical lugs. A disadvantage of this arrangement is the need for tools to assemble and disassemble this type of power bus. Another arrangement used to conduct power from the main control module to the axis modules is discrete wiring looping from module to module with pin and socket type connectors. This type of arrangement requires that the wiring be sized and positioned to avoid conduction heating and induction losses which affect the power bus voltage. With both arrangements discussed above for power conduction, it is important to appropriately shield the power conductors when energized since these conductors typically are at an electrical potential of 360 to 480 volts.

In view of the problems involved with providing communications and power between a main motor control unit and the axis modules, it would be desirable to provide an improved communications and power bus for connecting the control unit and modules.

SUMMARY OF THE INVENTION

The present invention relates to the electrical interconnection of the components of a motor control system. The motor control system includes a motor control unit and at least two axis modules electrically connected, and supported by a common mechanical support. The control unit includes a first line of output connectors including a first pair of power connectors. One of the axis modules includes a first line of input connectors electrically connected to the first line of output connectors, a second pair of power connectors connected to the first pair of power connectors, and a second line of output connectors parallel to the first line of input connectors and including a third pair of power connectors connected to the second pair of power connectors. The second axis module includes second line of input connectors electrically connected to the second line of output connectors, a fourth pair of power connectors connected to the third pair of power connectors, and a third line of output connectors parallel to the second line of input connectors and including a fifth pair of power connectors connected to the fourth pair of power connectors. Each line of connectors includes a first set of communication connectors adjacent a second set of communication connectors, and a third set of communication connectors. The first sets of communication connectors in the first output line and the first input line are connected, the second set of communication connectors in the first input line are connected with the first set of the communication connectors on the second output line, the first set of communications connectors on the second output line are connected to the first set of communications connectors on the second input line, the second set of communications connectors on the second input line are connected with the first set of communications connectors on the third output line, and the third set of communication connectors from all lines are connected.

Another embodiment of the motor control and electrical interconnections therein also includes a motor control unit and at least two axis modules. The motor control unit includes a housing having a first face surface bounded by a first side, and a first line of electrical connectors disposed at and parallel to the first side. One of the axis modules includes a second housing having a second face surface having a width bounded by second and third sides, and second and third lines of electrical connectors mechanically supported by a first support having a width at least as narrow as the width. The first support is slidably supported by the first axis module at the second face. A second axis module includes a third housing having a third face surface having the width bounded by fourth and fifth sides, and fourth and fifth lines of electrical connectors mechanically supported by a second support having a width at least as narrow as the width. The second support is slidably supported by the second axis module at the third face. The system further includes a mechanical support configured to support the control unit and modules such that the first, second and third faces lay in generally the same plane, the first and second side substantially abut, and the third and forth sides substantially abut. When the unit and modules are connected, the first support overlaps the first face and the second support overlaps the second face.

The present invention also relates to an axis module including an electric motor control circuit, a first line of at least twenty-two connectors, and a second line of at least twenty-two connectors parallel to the first line. The bottom two connectors of the first and second lines are power connectors, the bottom six connectors of the first and second lines are electrically connected; the top four connectors of the first line are electrically connected to the motor control circuitry, the bottom four of the top eight connectors of the first line are electrically connected to the top four connectors of the second line, the bottom four of the top twelve connectors of the first line are electrically connected to the bottom four of the top eight connectors of the second line, and the bottom four of the top sixteen connectors of the first line are electrically connected to the bottom four of the top twelve connectors of the second line.

BRIEF DESCRIPTION OF THE DRAWINGS

FIG. 6 is a rear perspective view of the interface between a bus portion and an axis module;

FIG. 7 is a front perspective view of the interface between the bus portion and an axis module;

FIG. 8 is an exploded front perspective view of the interface between the bus portion and an axis module;

FIG. 9 is a rear perspective view of a bus portion;

FIG. 10 is a front perspective view of the bus portion;

FIG. 11 is an exploded front perspective view of the bus portion; and

DETAILED DESCRIPTION OF THE PREFERRED EMBODIMENT

Figure 1:
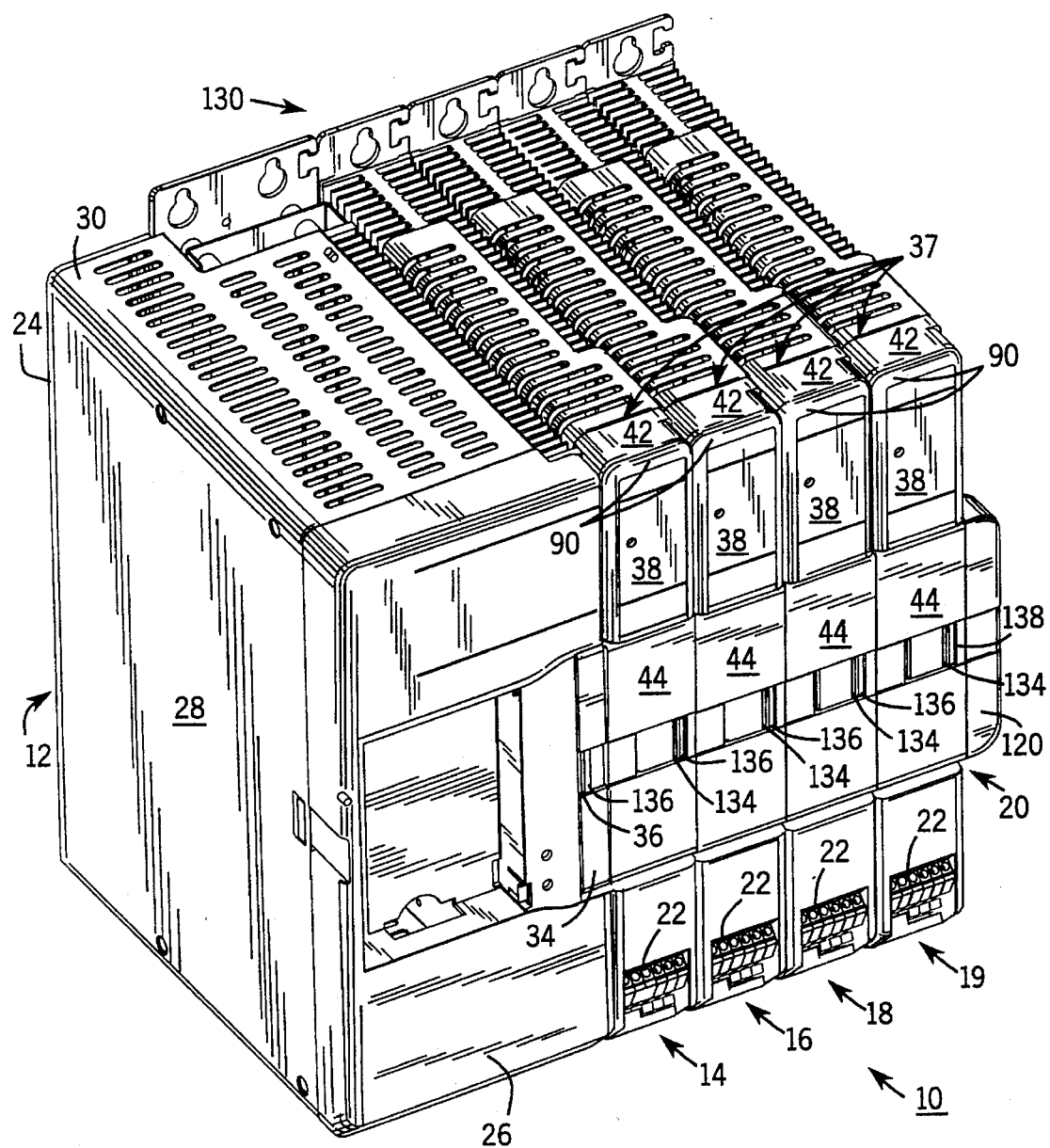
FIG. 1 is a perspective view of one embodiment of a motor control system including a data and power bus according to the present invention.

Referring to FIG. 1, a motor control system 10 includes a motor control unit 12, a first motor control axis module 14, a second motor control axis module 16, a third motor control axis module 18, a fourth motor control axis module 19, and a combination data and power bus 20. The mechanical and electrical features of each motor axis module 14, 16, 18 and 19 discussed in detail herein are substantially the same. Accordingly, for each element of modules 14, 16, 18 and 19 which are the same, the same reference number will be used irrespective of the module upon which the element is located. Each module 14, 16, 18 and 19 includes a terminal block 22 which includes a plurality of connectors which are provided to connect the respective modules 14, 16, 18 and 19 to an associated motor (not shown). In general, modules 14, 16, 18 and 19 produce three-phase electrical power at terminal blocks 22. This power is supplied to the associated motor by appropriate conductors. Additionally, terminal blocks 22 are connected to encoders or other types of positional and velocity signal producing devices which apply position signals to terminal blocks 22 for communication from the respective modules 14, 16, 18 and 19 to control unit 12 via data and power bus 20.

Motor control unit 12 includes a digital processing unit, memory, analog-to-digital conversion circuits, and other circuitry depending upon the particular use and configuration of unit 12. For example, control unit 12 may operate as a servo controller, motion controller, or as a CNC interface. In operation, motor control unit 12 receives motor position and velocity information produced by the motors connected to axis modules 14, 16, 18 and 19 to generate electric current commands applied to each of modules 14, 16, 18 and 19 which generate three-phase power (eg., 380 or 460 volts) at a current required to operate the motor at a desired speed and torque.

The current commands generated by motor control unit 12 are based upon the motion required for each of the motors controlled by system 10. By way of a specific example, a typical application for motor control system 10 is the control of a multi-axis (e.g., four-axis) machine tool. An appropriate program for controlling the machine tool is stored in the memory of control unit 12, and control unit 12 applies appropriate current signals to each of modules 14, 16, 18 and 19 depending upon the position and/or velocity signals fed back from the motor to control unit 12 via the respective modules 14, 16, 18 and 19 and bus 20. By way of another example, motor control system 10 could also be used with a multi-motor conveyor line, wherein each motor of the conveyor line is connected to an axis module 14, 16, 18 or 19, and appropriately controlled by the interaction of control unit 12 and modules 14, 16, 18 and 19. Control unit 12 and modules 14, 16 and 18 are electrically coupled by bus 20 as discussed in detail below to provide a system which permits the use of at least 1–4 motors, wherein bus 20 is readily modifiable to add or remove one or more module 14, 16, 18 or 19 based upon the number of motors included in a system (e.g., machine tool or conveyor line) to be controlled by motor control system 10.

Figure 2:
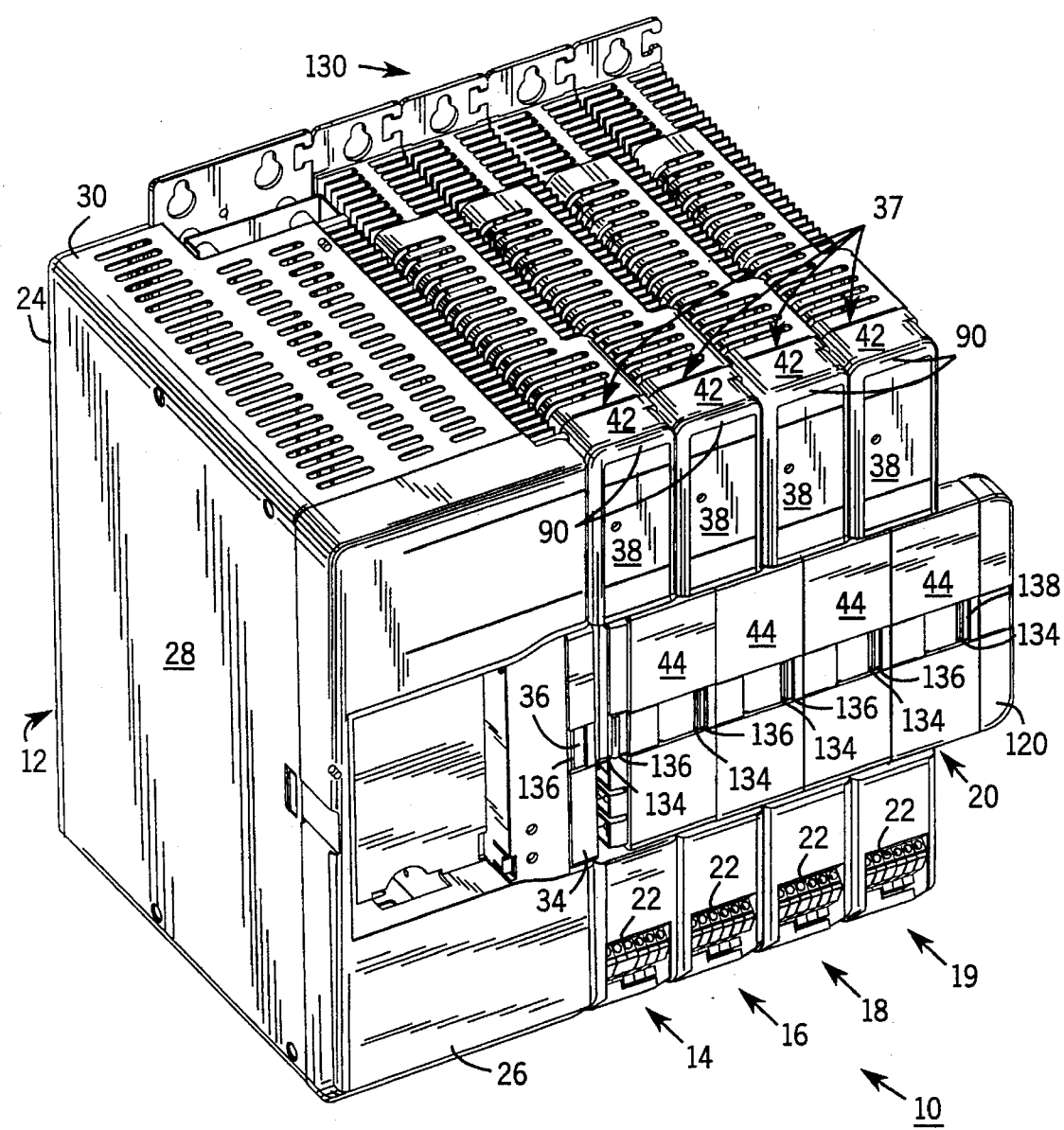
FIG. 2 is a perspective view of the motor control system with the data and power bus partially disconnected.
Figure 3:
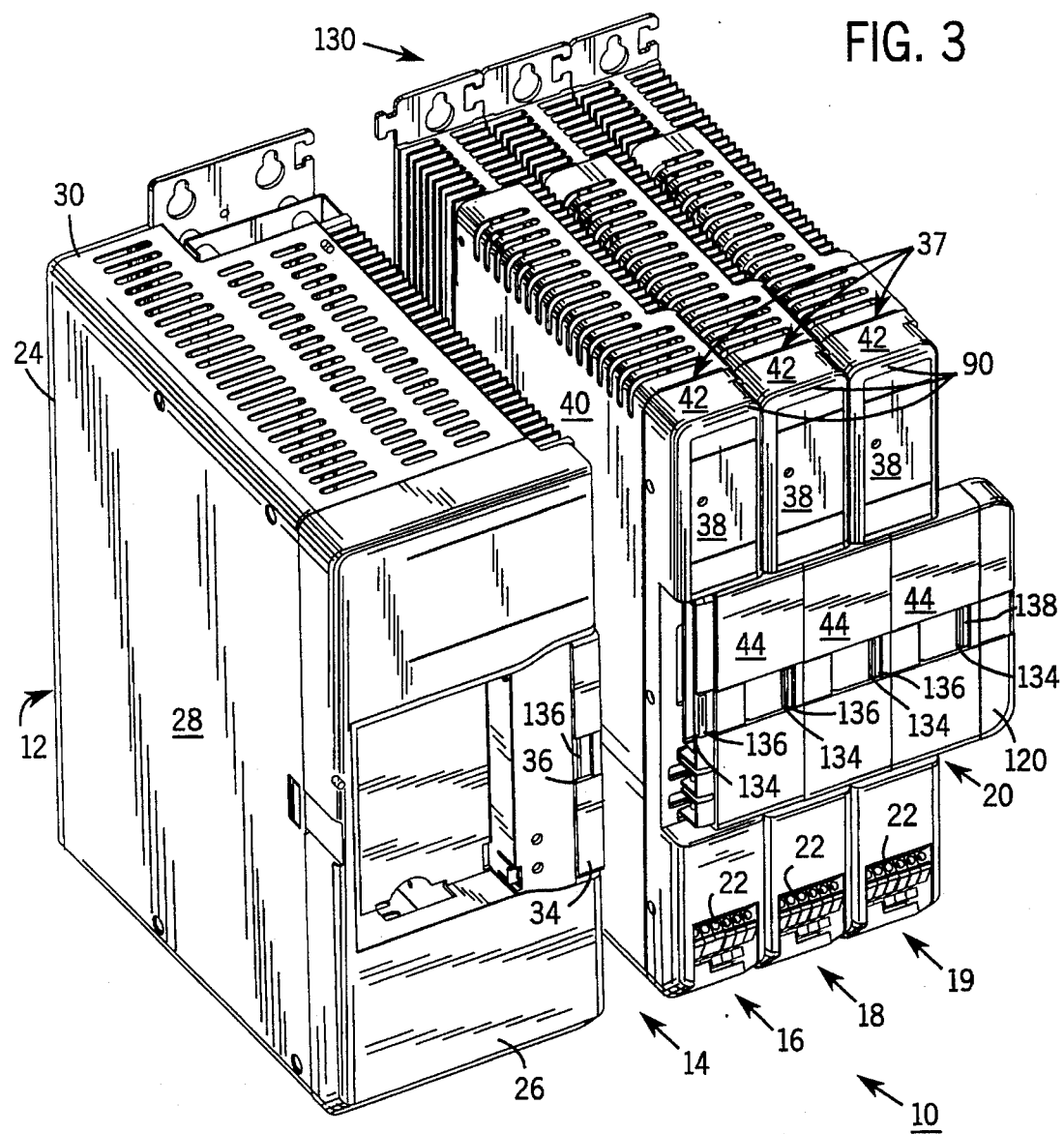
FIG. 3 is a perspective view of the motor control system with the data and power bus disconnected and a portion of the system removed.
Figure 4:
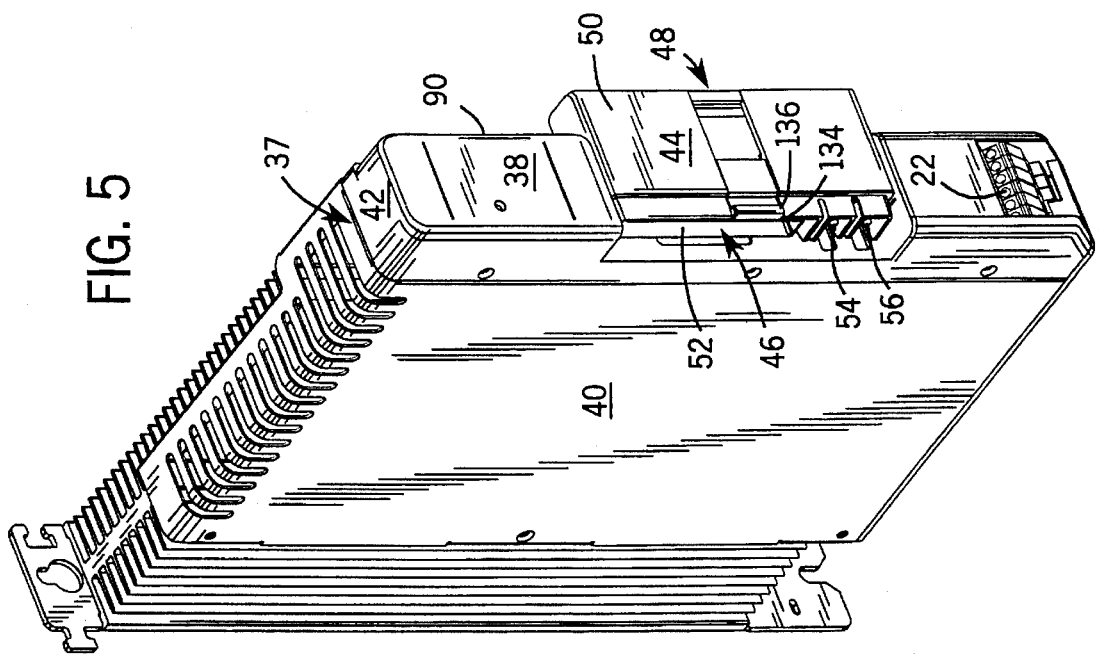
FIGS. 4 and 5 are perspective views of motor control axis modules of the system illustrating positioning of portions of the data and power bus.
Figure 5:
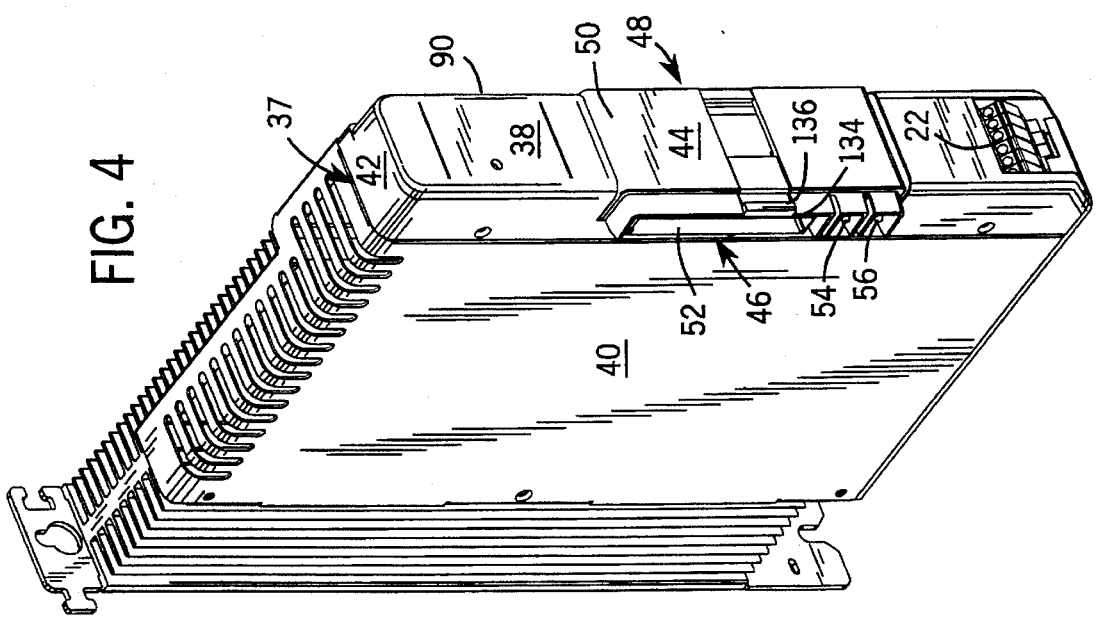

Turning now to a more detailed description of motor control unit 12, motor control unit 12 includes a housing 24 having a front surface 26, a first vertical side 28, a second vertical side (not shown), a top horizontal side 30, a bottom horizontal side (not shown), and a back vertical side (not shown), assembled as shown in FIGS. 1, 2 and 3 to produce housing 24. At front surface 26, control unit 12 includes a line of connectors 32 (schematically shown in FIG. 12) and located under a cover 34. Connectors 32 include both communications and data connectors, and power connectors (further discussed below in conjunction with FIG. 12). The line of connectors 32 are housed within a plastic cover 34 which includes a latch aperture 36.

Each of modules 14, 16, 18 and 19 include a front surface 38, a first vertical side 28, a second vertical side (not shown), a top horizontal side 42, a bottom horizontal side (not shown), and a back vertical side (not shown) assembled to provide the housings 37 as shown in FIGS. 1, 2, 3, 4 and 5. In addition to terminal blocks 22, housings 37 and the circuitry contained therein, modules 14, 16, 18 and 19 each include a bus portion 44.

Each bus portion 44 includes an input line of connectors 46 and an output line of connectors 48 supported by a plastic support structure and insulator 50. Connector lines 46 and 50 both include data and communication connectors 52, and power connectors 54 and 6 (FIGS. 6–12).

Figure 12:
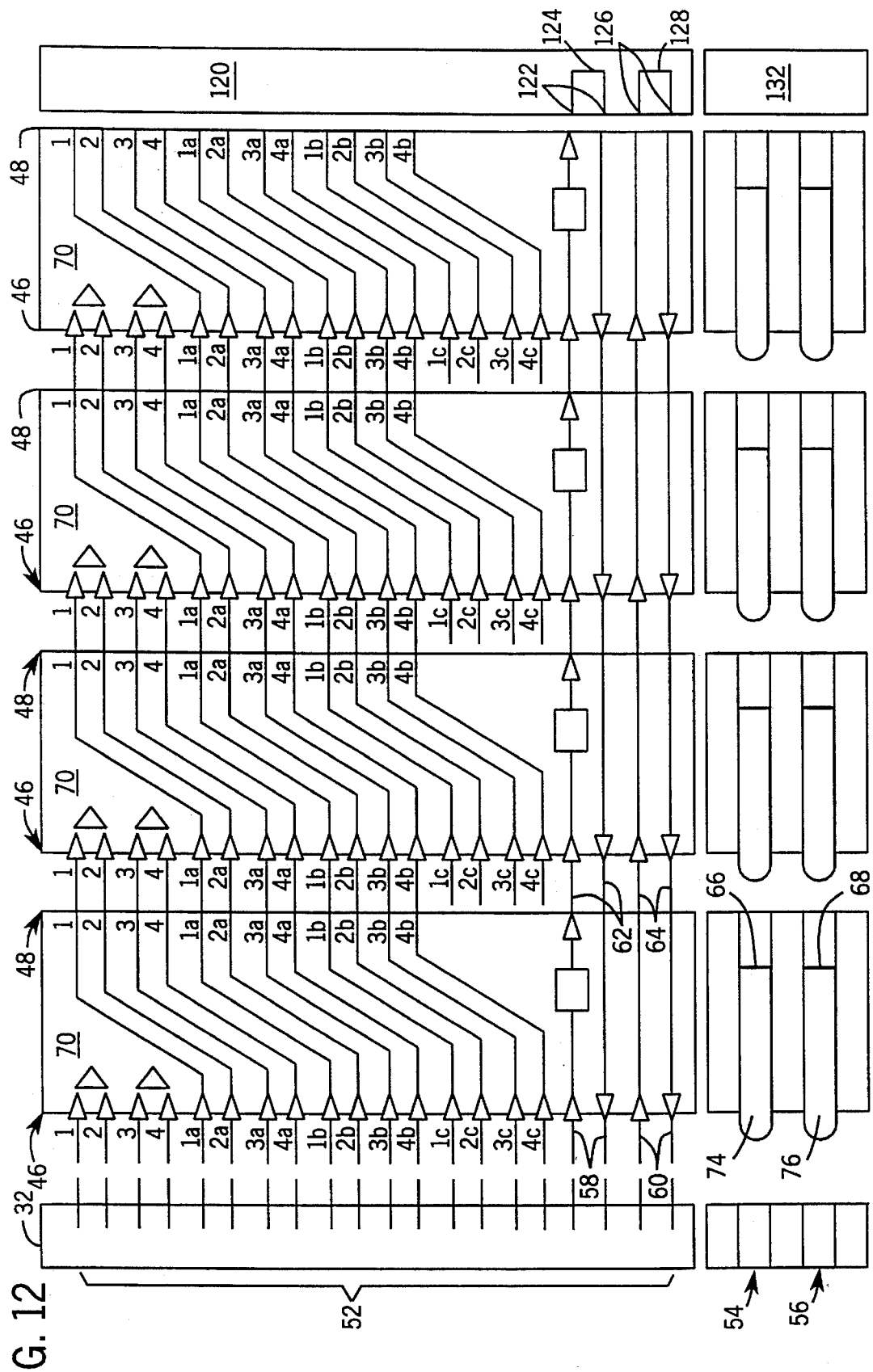
FIG. 12 is a schematic circuit diagram of the data and power bus.

The details of each line of connectors are illustrated in FIG. 12. More specifically, input lines 46 include a first set (1, 2, 3 and 4) of communication connectors, a second set (1a, 2a, 3a and 4a) of communication connectors, a third set (1b, 2b, 3b and 4b) of communication connectors, a fourth set (1c, 2c, 3c and 4c) of communication connectors, a pair 58 of safety interlock connectors, a pair of communications ring connectors 60, and power connectors 54 and 56. Output connector lines 48 each include a first set (1, 2, 3, 4) of communications connectors, a second set (1a, 2a, 3a, 4a) of communications connectors, and a third set (1b, 2b, 3b, 4b) of communications connectors, a pair of safety interlock connectors 62, a pair of communication ring connectors 64, and a pair of power connectors 66 and 68.

The connectors of lines 46 and 48 have opposite genders such that input and output connectors 46 and 48 can be electrically connected appropriately. The connectors of lines 46 and 48 for each bus portion 44 are electrically connected together by a printed circuit board 70 which is electrically connected to a 25 pin connector 72 (see FIGS. 6 and 8). As shown in FIG. 12, printed circuit board 70 includes conductors for electrically connecting connectors 1a–4a of line 46 to connectors 1–4 of line 48, connecting connectors 1b–4b of line 46 to connectors 1a–4a of line 48, connecting connectors 1b–4b of line 46 to connectors 1a–4a of line 48, connecting lines 1c–4c of line 46 to connectors 1b–4b of line 48, connecting connectors 58 of line 46 to connectors 62 of line 48, and connecting connectors 60 of line 46 to connectors 64 of line 48. Power connectors 54 and 56 are connected to connectors 66 and 68 by appropriate wires or busbars 74, 76 which are capable of carrying relatively high current (e.g., 10–20 amps) at relatively high voltage (e.g., 300–500 volts). As with the communication connectors, the gender of connectors 54 and 56 is opposite the gender of connectors 66 and 68 so that these connectors may be electrically connected to conduct power from control unit 12 to modules 14, 16, 18 and 19. Busbars 74 and 76 are connected to the circuitry of their respective modules 14, 16, 18 and 19 by conductors 78 and 80, which extend from bus portion 44 into the interior of respective housing 37.

Referring to FIGS. 6–11, the components of bus portion 44 are mechanically supported by plastic support structure and insulator 50. More specifically, connectors 52 and 54 are mechanically and electrically attached to printed circuit (PC) board 70, which is fastened (screwed or riveted) within a communications duct 82 of insulator 50. Connector 54, connector 66 and associated busbar 74 are fastened within a first insulating channel 84, and connector 56, connector 68 and busbar 76 are fastened within a second insulating channel 86. Separate insulating ducts 84 and 86 are provided because of the high voltage and currents which are present on busbars 74 and 76. Additionally, to further insulate busbars 74 and 76 and the associated connectors 54, 66, 56 and 68, channels 84 and 86 are enclosed by an insulating plate 88 fastened (screwed or riveted) to insulator 50.

In addition to the components discussed above, housing 37 includes a front cover portion 90 including front surface 38. Front cover portion 90 includes a translation channel 92 which slidably supports bus portion 44 and all the components thereof along a horizontal axis parallel to front surface 38. (The purpose of the sliding motion of bus portion 44 will be described in further detail below.) More specifically, insulator 50 includes slide guides 94, 96 and 98 (FIG. 9) which are located and slidably mounted within guide channels 100, 102 and 104 of translation channel 92. Guides 94, 96 and 98 are held within their respective guide channels 100, 102 and 104 by appropriate fasteners (e.g., screw and washer assemblies 106, 108 and 110, respectively, FIG. 6).

Translation channel 92 also includes openings 112, 114 and 116 through which connector 72, conductor 78 and conductor 80 extend, respectively. Openings 112, 114 and 116 are sized and elongated such that connector 72, conductor 78 and conductor 80 do not interfere with the bottom wall 118 of translation channel 92 when bus portion 40 is translated during connection and disconnection of bus portions 44.

In addition to line connector 32 and associated plastic cover 34 of motor control unit 12 and bus portions 44, data and power bus 20 includes a terminator plug 120 (FIGS. 1–3 and 12). Terminator plug 120 includes connectors 122 which are short circuited by a conductor 124, and connectors 126 which are short circuited by a conductor 128 (see FIG. 12). The purpose of connectors 122 and conductor 124 is to complete the safety interlock loop extending between unit 12 and modules 14, 16, 18 and 19. Similarly, the purpose of connectors 126 and conductor 128 is to complete the communications ring extending between motor control unit 12 and modules 14, 16, 18 and 19. When unit 12 and modules 14, 16, 18 and 19 are mechanically supported by support structure 130, and bus modules 44 are mechanically and electrically engaged with terminal plug 120 and line connector 32 and associated plastic cover 34 as shown in FIG. 1, unit 12 determines if there is continuity between top and bottom conductors 58 and will not energize power conductors 54 and 56 unless continuity exists. Alternatively, continuity could be checked between top and bottom conductors 60 in lieu of or in addition to the continuity check between top and bottom conductors 58.

Terminator plug 120 also includes an insulator portion 142 which covers connectors 66 and 68 of module 19 when bus 20 of system 10 is assembled. Insulator 32 protects inadvertent contact with connectors 66 and 68 of power busbars 74 and 76 when energized.

Turning again to FIGS. 1–3, each plastic support structure in insulator 50 is configured to have a width which is the same as the width of its associated module 14, 16, 18 and 19. Additionally, each insulator 0 includes a latch aperture 134 and a latch 136. To connect bus portions 44, all of the portions are slid within translation channel 92 toward the left until connector line 46 of module 14 is electrically engaged with connector line 32 of motor control unit 12, latch 136 of module 14 is engaged with latch aperture 36, and connector lines 46 and 48 of adjacent modules 14, 16, 18 and 19 are engaged, latches 136 and latch apertures 134 of adjacent modules 14, 16, 18 and 19 are engaged, and terminator plug 120 is engaged with bus portion 44 of module 19. As with insulators 50, terminator plug 120 also includes a latch 138 which engages latch aperture 134 of module 19.

As discussed above, plastic support structure and insulator 50 has a width which is the same as the width of the associated module 14, 16, 18 or 19 to permit removal of an intermediate module such as 14, 16 or 18. FIG. 3 shows system 10 with module 14 removed. By providing insulator 50 with this width, an intermediate module can be removed by sliding all bus portions 44 to their rightmost positions within associated translation channels 92, and then sliding bus portion 44 of the module to be removed out of engagement with the modules on both sides thereof. Subsequently, the module to be removed can be disassociated with support structure 30 and removed from system 10. By way of example, portions 44 of a module may be slid to the right so that between 20% and 40% of the portion 44 overlaps the bottom wall 118 of an adjacent module.

When all of the bus portions 44 of data and power bus 20 are engaged, line 46 of module 14 and insulator 50 overlap or overlay front surface 26 of motor control unit 12. Similarly, lines 46 and associated insulators 50 of adjacent modules overlay the wall 118 of the modules to their left.

While one embodiment of the present invention has been disclosed and described in detail, it should be clear that changes and modifications may be made to the embodiment without departing from the scope and spirit of the invention as defined in the claims appended hereto.

What is claimed is:

1. A motor control system comprising:
   a motor control unit including a first line of output connectors including a first pair of power connectors;
   a first axis module including a first line of input connectors electrically connected to the first line of output connectors and including a second pair of power connectors connected to the first pair of power connectors, and a second line of output connectors parallel to the first line of input connectors and including a third pair of power connectors connected to the second pair of power connectors; and
   a second axis module including a second line of input connectors electrically connected to the second line of output connectors and including a fourth pair of power connectors connected to the third pair of power connectors, and a third line of output connectors parallel to the second line of input connectors and including a fifth pair of power connectors connected to the fourth pair of power connectors;
   wherein each line of connectors includes a first set of communication connectors adjacent a second set of communication connectors, and a third set of communication connectors, the first sets of communication connectors in the first output line and the first input line being connected, the second set of communication connectors in the first input line being connected with the first set of the communication connectors on the second output line, the first set of communications connectors on the second output line being connected to the first set of communications connectors on the second input line, the second set of communications connectors on the second input line being connected with the first set of communications connectors on the third output line, and the third set of communication connectors from all lines being connected.

2. The system of claim 1, wherein each of the first and second sets of communications connectors include four connectors.

3. The system of claim 2, wherein the third sets of communications connectors includes two connectors.

4. The system of claim 3, further comprising a termination connector including a conductor providing a short circuit between the two connectors of the third set of communications connectors of the third output line.

5. The system of claim 1, wherein each line of connectors includes a fourth set of communications connectors with all of the fourth sets of communications connectors being connected.

6. In a motor control system including a motor control unit including a first line of output connectors including a first pair of power connectors, and a first axis module including a first line of input connectors electrically connected to the first line of output connectors and including a second pair of power connectors connected to the first pair of power connectors, and a second line of output connectors parallel to the first line of input connectors and including a third pair of power connectors connected to the second pair of power connectors, a second axis module comprising:
   a second line of input connectors electrically connected to the second line of output connectors and including a fourth pair of power connectors connected to the third pair of power connectors; and
   a third line of output connectors parallel to the second line of input connectors and including a fifth pair of power connectors connected to the fourth pair of power connectors;
   wherein each line of connectors includes a first set of communication connectors adjacent a second set of communication connectors, and a third set of communication connectors, the first sets of communication connectors in the first output line and the first input line being connected, the second set of communication connectors in the first input line being connected with the first set of the communication connectors on the second output line, the first set of communications connectors on the second output line being connected to the first set of communications connectors on the second input line, the second set of communications connectors on the second input line being connected with the first set of communications connectors on the third output line, and the third set of communication connectors from all lines being connected.

7. The axis module of claim 6, wherein each of the first and second sets of communications connectors include four connectors.

8. The axis module of claim 7, wherein the third sets of communications connectors includes two connectors.

9. The axis module of claim 6, wherein each line of connectors includes a fourth set of communications connectors with all of the fourth sets of communications connectors being connected.

10. An axis module of the type including electric motor control circuitry, the module comprising:
   a first line of at least twenty-two connectors; and
   a second line of at least eighteen connectors parallel to the first line;
   wherein the bottom two connectors of the first and second lines are power connectors, the bottom four connectors of the first and second lines are electrically connected; the top four connectors of the first line are electrically connected to the motor control circuitry, the bottom four of the top eight connectors of the first line are electrically connected to the top four connectors of the second line, the bottom four of the top twelve connectors of the first line are electrically connected to the bottom four of the top eight connectors of the second line, and the bottom four of the top sixteen connectors of the first line are electrically connected to the bottom four of the top twelve connectors of the second line.

11. The module of claim 10 further comprising an insulating support mechanically connected to the first and second lines of connectors.

12. The module of claim 11 further comprising a housing defining an exterior surface, the insulating support being attached to the module to slide relative to the exterior surface.

13. The module of claim 12 further comprising a printed circuit board electrically connecting the first and second lines of connectors.

14. A motor control system comprising:
   a motor control unit including housing having a first face surface bounded by a first side, and a first line of electrical connectors disposed at and parallel to the first side;
   a first axis module including a second housing having a second face surface having a width bounded by second and third sides, and second and third lines of electrical connectors mechanically supported by a first support having a width at least as narrow as the width, the first support being slidably supported by the first axis module at the second face;
   a second axis module including a third housing having a third face surface having the width bounded by fourth and fifth sides, and fourth and fifth lines of electrical connectors mechanically supported by a second support having a width at least as narrow as the width, the second support being slidably supported by the second axis module at the third face; and
   a mechanical support configured to support the control unit and modules such that the first, second and third faces lay in generally the same plane, the first and second side substantially abut, and the third and forth sides substantially abut, wherein the first support overlaps the first face when the first and second lines of connectors are electrically connected, and the second support overlaps the second face when the third and forth lines of connectors are electrically connected.

15. The system of claim 14, wherein each line of connectors includes a first set of communication connectors adjacent a second set of communication connectors, and a third set of communication connectors, the first sets of communication connectors in the first line and the second line being connected, the second set of communication connectors in the second line being connected with the first set of the communication connectors in the third line, the first set of communications connectors in the fourth line being connected to the first set of communications connectors in the third line, the second set of communications connectors in the fourth line being connected with the first set of communications connectors in the fifth line, and the third set of communication connectors from all lines being connected.

16. The system of claim 15 wherein each of the first and second sets of communications connectors include four connectors.

17. The system of claim 16, further comprising a termination connector including a conductor providing a short circuit between at least two connectors of the third set of communications connectors of the fifth line.

18. The system of claim 14, further comprising third and forth axis modules having substantially the same mechanical structure and configuration as the second axis module, and supported by the mechanical support adjacent to each other and the second axis module, with the third axis module being electrically connected between the second and fourth axis modules.

19. In a motor control system including a motor control unit including housing having a first face surface bounded by a first side, and a first line of electrical connectors disposed at and parallel to the first side; a first axis module including a second housing having a second face surface having a width bounded by second and third sides, and second and third lines of electrical connectors mechanically supported by a first support having a width at least as narrow as the width, the first support being slidably supported by the first axis module at the second face; and a mechanical support; a second axis module comprising:
   a third housing having a third face surface having the width bounded by fourth and fifth sides;
   a second support having a width at least as narrow as the width, the second support being slidably supported by the second axis module at the third face; and
   fourth and fifth lines of electrical connectors mechanically supported by the second support;
   wherein the mechanical support is configured to support the control unit and modules such that the first, second and third faces lay in generally the same plane, the first and second side substantially abut, and the third and forth sides substantially abut, wherein the first support overlaps the first face when the first and second lines of connectors are electrically connected, and the second support overlaps the second face when the third and forth lines of connectors are electrically connected.

20. The axis module of claim 19, wherein each line of connectors includes a first set of communication connectors adjacent a second set of communication connectors, and a third set of communication connectors, the first sets of communication connectors in the second line being connected to the second set of communication connectors in the third line, and the third set of communication connectors from the second and third lines being connected.

21. The axis module of claim 20, wherein each of the first and second sets of communications connectors include four connectors.

* * * * *